US012772861B2

(12) United States Patent
McDonald et al.

(10) Patent No.: US 12,772,861 B2
(45) Date of Patent: Oct. 20, 2026

(54) PACKAGING SUBSTRATE

(71) Applicant: Silego Technology Inc., Santa Clara, CA (US)

(72) Inventors: John McDonald, Sunnyvale, CA (US); Tom Truong, Sunnyvale, CA (US); David Kunteh Chow, Sunnyvale, CA (US)

(73) Assignee: Silego Technology Inc., Santa Clara, CA (US)

( * ) Notice: Subject to any disclaimer, the term of this patent is extended or adjusted under 35 U.S.C. 154(b) by 711 days.

(21) Appl. No.: 18/340,366

(22) Filed: Jun. 23, 2023

(65) Prior Publication Data

US 2023/0335511 A1 Oct. 19, 2023

Related U.S. Application Data

(62) Division of application No. 16/370,590, filed on Mar. 29, 2019, now abandoned.

(51) Int. Cl.
*H10D 1/20* (2025.01)
*H10W 44/00* (2026.01)
(Continued)

(52) U.S. Cl.
CPC ............ *H10W 44/501* (2026.01); *H10D 1/20* (2025.01); *H10W 70/65* (2026.01); *H10W 70/69* (2026.01)

(58) Field of Classification Search
CPC ... H10W 44/501; H10W 70/65; H10W 70/69; H10D 1/20
See application file for complete search history.

(56) References Cited

U.S. PATENT DOCUMENTS 5,793,272 A 8/1998 Burghartz et al.
5,884,990 A 3/1999 Burghartz et al.
(Continued)

FOREIGN PATENT DOCUMENTS

CN 105321926 A 2/2016
CN 107408513 A 11/2017
(Continued)

OTHER PUBLICATIONS

U.S. Patent Office Non-final Office Action (U.S. Appl. No. 16/370,590) Feb. 24, 2023 (Year: 2023).*
(Continued)

*Primary Examiner* — Malcolm Barnes
(74) *Attorney, Agent, or Firm* — Saile Ackerman LLC; Stephen B Ackerman

(57) ABSTRACT

A packaging substrate and a method for mounting an integrated circuit and/or a circuit component is presented. The packaging substrate includes an upper surface for mounting the integrated circuit and/or circuit component; a lower surface opposite to the upper surface, wherein the lower surface is for mounting to a printed circuit board (PCB); a non-conductive material; wherein the non-conductive material is a plastic: an inductor structure at least partially embedded in the non-conductive material; first and second conductive materials, and conductive pillars, arranged to form a first coil and a second coil having an inductance; wherein the first coil and second coil are arranged as a toroid transformer wound in a double helix configuration.

12 Claims, 11 Drawing Sheets

(51) Int. Cl.
*H10W 70/65* (2026.01)
*H10W 70/69* (2026.01)

(56) References Cited

U.S. PATENT DOCUMENTS

| | | | | |
|---|---|---|---|---|
| 6,104,707 | A * | 8/2000 | Abraham | H02J 13/1313 340/310.17 |
| 6,578,754 | B1 | 6/2003 | Tung | |
| 6,750,588 | B1 * | 6/2004 | Gabrys | H02K 19/06 310/268 |
| 7,795,071 | B2 | 9/2010 | Jimm et al. | |
| 7,932,590 | B2 | 4/2011 | Lam | |
| 10,470,309 | B2 | 11/2019 | Erturk et al. | |
| 2001/0016976 | A1 | 8/2001 | Ahn et al. | |
| 2002/0095768 | A1 * | 7/2002 | Ahn | H01F 17/0033 257/E27.046 |
| 2004/0124545 | A1 * | 7/2004 | Wang | H10W 70/092 257/784 |
| 2007/0090912 | A1 | 4/2007 | Lee | |
| 2008/0136575 | A1 * | 6/2008 | Edo | H01F 27/2804 336/200 |
| 2008/0186124 | A1 * | 8/2008 | Schaffer | H01F 27/2895 336/200 |
| 2009/0160595 | A1 * | 6/2009 | Feng | H01F 17/0033 336/200 |
| 2010/0019346 | A1 | 1/2010 | Erturk et al. | |
| 2010/0022063 | A1 | 1/2010 | Erturk et al. | |
| 2012/0105190 | A1 * | 5/2012 | Mitani | H01F 37/00 336/221 |
| 2016/0133614 | A1 | 5/2016 | Gu et al. | |
| 2016/0233153 | A1 * | 8/2016 | Kidwell, Jr. | H01F 17/0033 |
| 2017/0149356 | A1 | 5/2017 | Biglarbegian et al. | |
| 2020/0006250 | A1 * | 1/2020 | Hill | G06F 1/28 |

FOREIGN PATENT DOCUMENTS

| | | |
|---|---|---|
| KR | 20110114238 A | 10/2011 |
| WO | 2016/005537 A2 | 1/2016 |

OTHER PUBLICATIONS

"Onchip embedded toroidal solenoid inductors and transformers formed by post-CMOS micromachining techniques," by Lei Gu et al., Microelectronic Engineering, vol. 85, Issue 4, Apr. 2008, pp. 697-703.

"Molded Interconnect Substrate," APSi, Downloaded Jun. 3, 2019 from www.advanpack.com/MIS.html, pp. 1-2.

"Molded Interconnect Substrate (MIS)," Downloaded Jun. 3, 2019, pp. 1-3, https://semiengineering.com/knowledge_centers/packaging/molded-interconnect-substrate/.

"Technology Licensing & IP Management from APS Perspectives," by Raymond Lim, Advanpack Solutions, Microsoft PowerPoint—Aug. 28, 2014—WIPO-IPOS Seminar—Distributable version, Downloaded Jun. 3, 2019, 23 pgs.

"Toroid Inductor on Chip," Google Search, Downloaded Jun. 3, 2019, pp. 1-2.

"MIS Packaging Takes off," Downloaded Jun. 3, 2019, pp. 1-11, www.semiengineering.com/mis-packaging-takes-off/.

"Packaging Solutions using MIS Platform," JCET, Downloaded Jun. 3, 2019, http://server.semiconchina.org/downloadFile/1460531162181.pdf, 23 pgs.

"Our Technologies," APSi, Downloaded Jun. 3, 2019, www.advanpack.com/technology.html, 1 page.

"On-Chip Spiral Inductors for Silicon-Based Radio-Frequency Integrated Circuits," by C. Patrick Yue, Center for Integrated Systems, Stanford University, CA, Downloaded Jun. 3, 2019, 56 pages, http://www-smirc.stanford.edu/papers/Orals98s-cpyue.pdf.

US Office Action, U.S. Appl. No. 16/370,590, Applicant: McDonald et al., Mail date: Sep. 3, 2021, 20 pages.

US Office Action, U.S. Appl. No. 16/370,590, Applicant: McDonald et al., Mail date: Jul. 27, 2022, 15 pages.

US Office Action, U.S. Appl. No. 16/370,590, Applicant: McDonald et al., Mail date: Feb. 24, 2023, 19 pages.

Chinese Office Action, Application No. 201911417170.9, Applicant: Silego Technology Inc., Mail date: Jul. 23, 2025, 10 pages.

Chinese Office Action, Application No. 201911417170.9, Applicant: Silego Technology Inc., Issued Mar. 13, 2025, 9 pages.

"3D Power Packaging made Real with Embedded Component and Substrate Technologies," PSMA Phase III Report, P M Raj et al., 3D Systems Packaging Research Center Georgia Institute of Technology, Mar. 2018, pp. 1-28.

"On-chip Inductors and Transformer," by James J. Wang, Applied Power Electronics Conference SP1.4 Power Supply on a Chip—PwrSoC, Feb. 2010, pp. 1-19.

"Advanced Packaging Technologies for Miniaturized Modules," by Vinayak Pandey, Product Technology Mardeting, STATS ChipAC, Jul. 2016, 14 pgs.

"Innovative Integration Solutions," Vinayak Pandey, JCET STATSChipPac, May 2017, 11 pgs.

On-Chip Spiral Inductors for RF Applications: An Overview, by Ji Chen et al., Journal of Semiconductor Technolog and Science, vol. 4, No. 3, Sep. 2004, pp. 149-167.

"Analysis of on-chip spiral inductors using the distributed capacitance model," by Chia-Hsin Wu et al., IEEE Journal of Solid-State Circuits , vol. 38, No. 6, Jun. 2003, pp. 1-2.

"Small Form Factor Package Trends to 2020," by Brandon Prior, Burn-in & Test Strategies Workshop, Mar. 15-18, 2015, 34 pgs.

"Molded Interconnect Substrate," by Chun, Google Search, Downloaded: Jun. 3, 2019, pp. 1-2, https://www.google.co.uk/search?rtz=1CHBF_ . . . .

"Copper Pillar Bump," Advanpack Solutions Pte Ltd © 2014, found: www.advanpack.com/cpb.html, Downloaded Jun. 3, 2019, 1 page.

"MIS for labels and packaging," FlexoTech, Whitmar Publications, Nov. 22, 2013, pp. 1-10.

"MIS—Molded Interconnect System," www.unisemgroup.com, 1page, MIS-Datasheet-7-12-17.pdf.

"Molded interconnect device," Wikipedia Search, Downloaded Jun. 3, 2019 from https://en.wikipedia.org/wiki/Molded_Interconnect_device, pp. 1-3.

* cited by examiner

PACKAGING SUBSTRATE

This is a Divisional application of U.S. patent application Ser. No. 16/370,590, filed on Mar. 29, 2019, which is herein incorporated by reference in its entirety, and assigned to a common assignee.

The present disclosure relates to a packaging substrate for mounting an integrated circuit and/or a circuit component. In particular the present disclosure relates to a packaging substrate comprising an inductor structure.

BACKGROUND

The field of electronic packaging relates to the design and fabrication of enclosures for electronic devices and systems. In modern consumer devices there is pressure for components to be smaller so that more functionality can be implemented in each device.

An inductor may be implemented in a circuit in a number of different ways, which may be dependent on the specific application and the physical constraints imposed by the manufacturing processes available. For example, spiral inductors may be fabricated on a silicon chip. Such structures are substantially planar which takes advantage of the planar metal layers in the chip fabrication process and therefore they are easy to build and have consistency in their performance. However, due to their structural limitations, spiral inductors may have a lower inductance than off-chip inductors and can be highly susceptible to nearby magnetic fields.

Electromagnetic (EM) susceptibility is reciprocal, and therefore since EM fields of a spiral inductor are not well contained, the spiral inductor affects and is affected by external EM fields. In essence, a spiral inductor may function as an antenna. In switching power supply applications, such electromagnetic interference (EMI) can be problematic, as the switching currents in the inductor can generate undesirable EM radiation that interferes with other electronic devices. Another effect of undesired coupling is that power is lost through the coupling.

Inductors may also be formed using a chip's bondwires. These inductors are cheap, however they have limited current capability and may have variable tolerances.

Known off-chip inductors, which may be mounted on a printed circuit board (PCB) include integrated iron core inductors which may be provided in a toroidal or solenoidal configuration. These inductors offer a high inductance per unit area, however can be costly to manufacture. An advantage of certain geometries such as toroids when compared to spiral inductors, is that magnetic fields associated with the circuit operation are more contained, and thus better for EMI and efficiency.

SUMMARY

It is desirable to provide an improved packaging substrate that comprises an inductor that overcomes or mitigates one or more of the above-mentioned problems.

According to a first aspect of the disclosure there is provided a packaging substrate for mounting an integrated circuit and/or a circuit component comprising an upper surface for mounting the integrated circuit and/or circuit component, a non-conductive material, an inductor structure at least partially embedded in the non-conductive material and comprising i) a first conductive material at least partially on a first layer, ii) a second conductive material at least partially on a second layer, and iii) a plurality of conductive pillars, wherein the first conductive material, the second conductive material and the conductive pillars are arranged to form a first coil having an inductance, and the first coil is arranged as one of a) a solenoid having an axis that is approximately parallel to the upper surface of the packaging substrate, and b) a toroid.

Optionally, the first conductive material is discontinuous, such that the first conductive material comprises a plurality of first conductive portions on the first layer, and the second conductive material is discontinuous, such that the second conductive material comprises a plurality of second conductive portions on the second layer, wherein each of the first conductive portions is coupled to at least one of the second conductive portions by at least one conductive pillar.

Optionally, at least one of the first conductive portions is coupled to one of the second conductive portions by a first conductive pillar and is coupled to another of the second conductive portions by a second conductive pillar.

Optionally, each of the first conductive portions is coupled to two conductive pillars, and for each first conductive portion, the two conductive pillars are coupled to different second conductive portions.

Optionally, the first coil is arranged as a toroid having an inner circumference and an outer circumference around a central axis, and the inner circumference is closer to the central axis than the outer circumference on a line extending outward from the central axis.

Optionally, the conductive pillars at or near the inner circumference are smaller than the conductive pillars at or near the outer circumference.

Optionally, for each of the first conductive portions, there are less conductive pillars at or near the inner circumference used to couple to one second conductive portion than at or near the outer circumference used to couple to another second conductive portion.

Optionally, the non-conductive material is a plastic.

Optionally, at least one of the first conductive material, the second conductive material and the conductive pillars comprises at least one of copper and aluminium.

Optionally, the first coil at least partially encloses a magnetic material.

Optionally, the packaging substrate is one of a molded interconnect substrate and a laminate substrate.

Optionally, the packaging substrate comprises a lower surface opposite to the upper surface.

Optionally, the lower surface is for mounting to a printed circuit board (PCB).

Optionally, the packaging substrate comprises a second coil having an inductance and arranged with the first coil to form a transformer or a coupled inductor.

Optionally, wherein the second coil comprises i) the first conductive material, ii) the second conductive material, and iii) another plurality of conductive pillars.

Optionally, the first and second coils are arranged as a toroid transformer wound in a double helix configuration.

Optionally, at least one of the first and second conductive materials are formed using routing traces.

Optionally, the conductive pillars comprises at least one via.

According to a second aspect of the disclosure there is provided a method of providing a packaging substrate for mounting an integrated circuit and/or a circuit component comprising an upper surface for mounting the integrated circuit and/or circuit component, a non-conductive material, an inductor structure at least partially embedded in the non-conductive material and comprising i) a first conductive material at least partially on a first layer, ii) a second conductive material at least partially on a second layer, and iii) a plurality of conductive pillars, wherein the first conductive material, the second conductive material and the conductive pillars are arranged to form a first coil having an inductance, and the first coil is arranged as one of a) a solenoid having an axis that is approximately parallel to the upper surface of the packaging substrate, and b) a toroid.

It will be appreciated that the method of the second aspect may include providing and/or using features set out in the first aspect and can incorporate other features as described herein.

BRIEF DESCRIPTION OF THE DRAWINGS

The disclosure is described in further detail below by way of example and with reference to the accompanying drawings, in which.

DESCRIPTION

Figure 1:
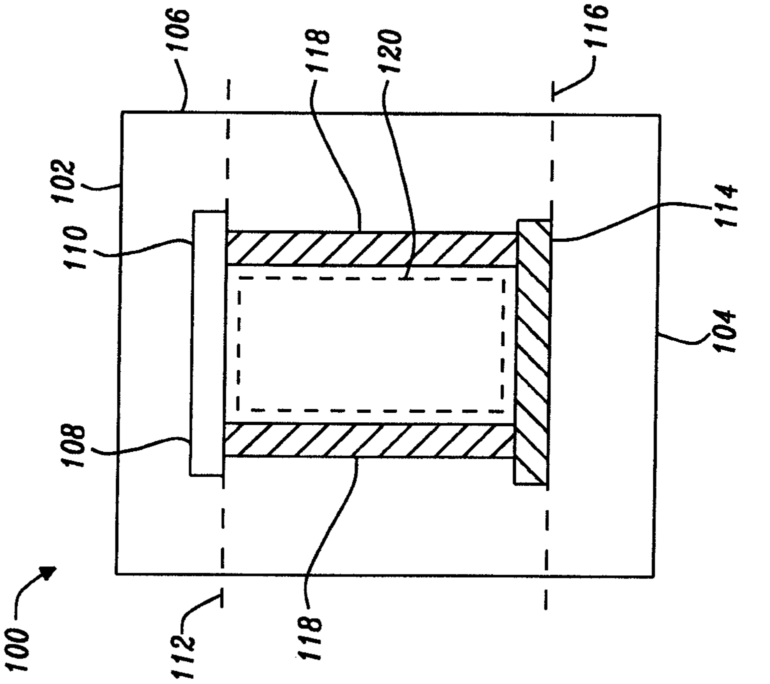
FIG. 1 is a schematic of a layer stack of a packaging substrate for mounting an integrated circuit and/or a circuit component in accordance with a first embodiment of the present disclosure.

FIG. 1 is a schematic of a layer stack of a packaging substrate 100 for mounting an integrated circuit and/or a circuit component in accordance with a first embodiment of the present disclosure. The packaging substrate 100 may be molded interconnect substrate (MIS) or a laminate substrate.

The packaging substrate 100 comprises an upper surface 102 for mounting the integrated circuit and/or circuit component and may comprise a lower surface 104 that is opposite to the upper surface 102. The packaging substrate 100 comprises a non-conductive material 106 and an inductor structure 108. The inductor structure 108 is at least partially embedded in the non-conductive material 106 and in the present embodiment, the inductor structure 108 is wholly embedded in the non-conductive material 106. The non-conductive material 106 may, for example, be a plastic.

The inductor structure 108 comprises a first conductive material 110 that is at least partially on a first layer 112, and a second conductive material 114 that is at least partially on a second layer 116. The inductor structure 108 further comprises a plurality of conductive pillars 118. Inductor structures of the type described herein, may be referred to as 3D inductors.

The first conductive material 110, the second conductive material 114 and the conductive pillars 118 may comprise copper and/or aluminium. Typically conductive pillars 118 comprising copper are referred to as copper pillars. Alternatively, the first conductive material 110, the second conductive material 114 and the conductive pillars 118 may comprise materials other than copper and/or aluminium, such as alloys with good conductivities.

The first conductive material 110, the second conductive material 114 and the conductive pillars 118 are arranged to form a coil (110+114+118) with an inductance. The non-conductive material 106 is electrically insulating when compared to the conductive materials 110, 114 and the conductive pillars 118. In effect the coil (110+114+118) forms a conducting part of an inductor. It will be appreciated that the part of the non-conductive material 106 that is enclosed by the coil (110+114+118) may affect the inductance of the coil (110+114+118). In the present embodiment the non-conductive material is a plastic material and may be referred to as an "air coil".

The coil (110+114+118) may be arranged as a solenoid which has an axis that is approximately parallel to the upper surface 102 of the packaging substrate 100. The axis of the solenoid is the axis around which the solenoid is wound. Alternatively, the coil (110+114+118) may be arranged as a toroid. In a further embodiment the coil (110+114+118) may partially or fully enclose a magnetic material 120. When the magnetic material 120 is omitted, the coil (110+114+118) may be referred to as an air core inductor. The magnetic material 120 can be used to increase the inductance of the inductor structure 108. The magnetic material 120 may comprise a polymer film and/or ferrite powders. Although individual grains of the ferrite powders may be conductive, the ferrite powder is not conductive in bulk.

It will be appreciated that additional conductive pillars 118 may be positioned behind the conductive pillars 118 that are visible in the schematic. Additionally, it should be noted that the schematic shown in FIG. 1 is a layer stack, rather than a cross section, and as such the visibility of features is not necessarily representative of their depth. For example, when viewing FIG. 1, one of the conductive pillars 118 may be positioned further away (into the page) than the other conductive pillar 118.

In a specific embodiment, when the coil (110+114+118) is arranged as the solenoid, the coil (110+114+118) may comprise a single loop where the first conductive material 110 is coupled to two conductive pillars 118, one of which is coupled to the second conductive material 114, and the other of which is disconnected from the second conductive material 114.

A coil loop may alternatively be referred to as a winding. The solenoids and toroids described herein may comprise multiple windings.

Figure 2:
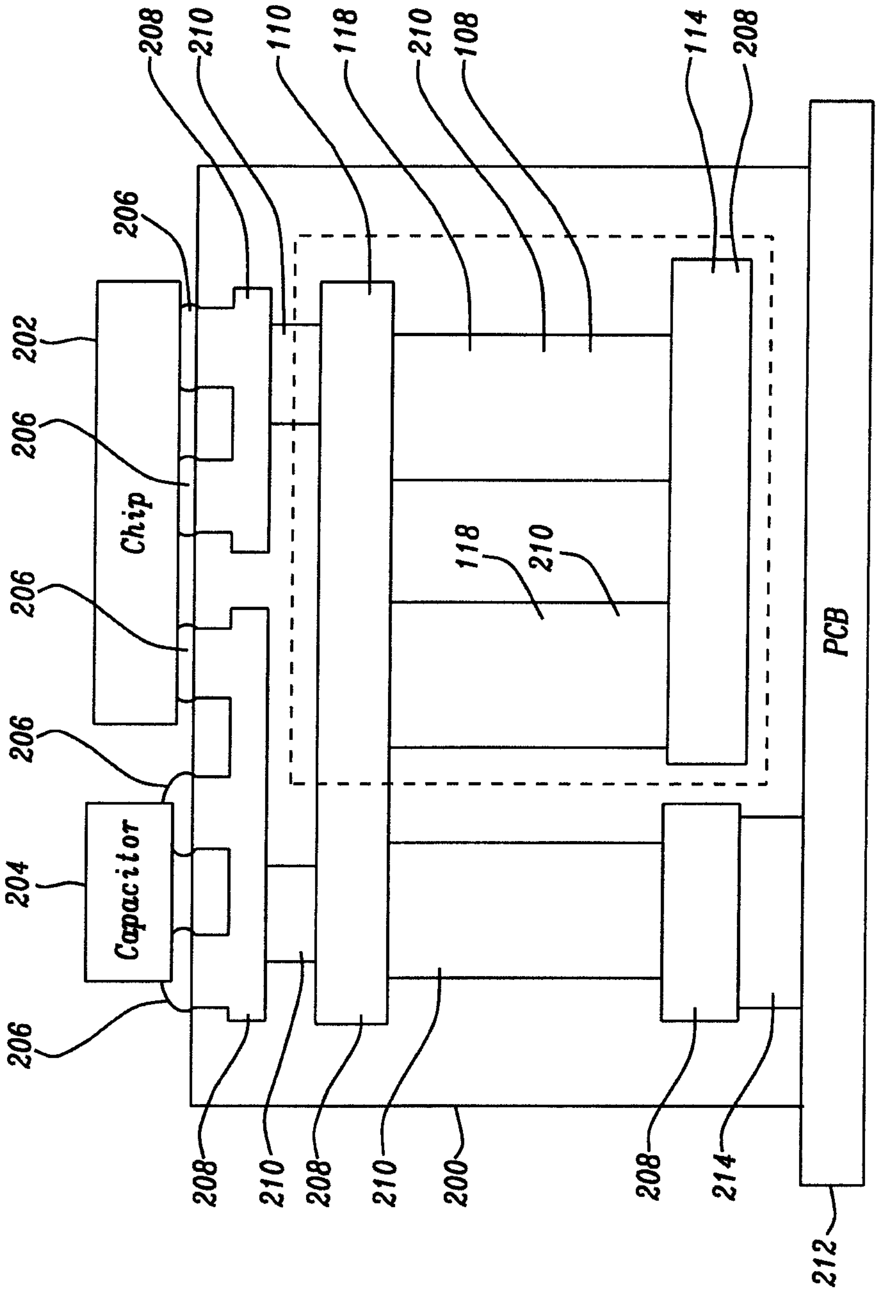
FIG. 2 is a schematic of a layer stack of a packaging substrate for mounting an integrated circuit and/or a circuit component in accordance with a second embodiment of the present disclosure.

FIG. 2 is a schematic of a layer stack of a packaging substrate 200 for mounting an integrated circuit 202 (which may be referred to as a chip) and/or a circuit component in accordance with a second embodiment of the present disclosure. The packaging substrate 200 of FIG. 2 shares common features with the packaging substrate 100 of FIG. 1 and therefore common features between figures share common reference numerals and variables.

Circuit components, such as a capacitor 204, may be mounted on the packaging substrate 200 using one or more solder bumps 206. The integrated circuit 202 is also mounted on the packaging substrate 200 using solder bumps 206.

The packaging substrate 200 can be used to mount multiple integrated circuits and other components together.

In the present embodiment, the packaging substrate 200 comprises routing traces 208, and vias 210. The inductor structure 108 is electrically connected to the integrated circuit 202 and the capacitor 204 by routing traces 208, vias 210 and solder bumps 206.

In the present embodiment, the lower surface 104 of the packaging substrate is suitable for mounting the packaging substrate 200 to a printed circuit board (PCB) 212. The packaging substrate 200 comprises a PCB solder pad 214 to provide an electrical connection between the packaging substrate 200 and the PCB 212.

The inductor structure 108 may be formed using processes and materials that are included in standard fabrication processes for packaging substrates. The packaging substrate 200 may, for example, be produced using standard methods for MIS or laminate substrates. For small ICs, laminate substrates are typically more expensive than MIS, however laminate substrates are likely to be economically better for large ICs with large substrates that require more than one inductor, when compared to MIS.

Building the inductor structure 108 into the packaging substrate 200 leverages a low cost processing step to create the inductor, and, the final product takes up minimal board area, as the chip 202 can be stacked on top of the inductor.

In addition to a specific packaging substrate, MIS may refer generally to the fabrication process provided for molded interconnect substrates and the conventions of this process. MIS is an in-package interconnect technology which allows layered interconnect patterns with features on the order of 25 μm.

MIS enables fabrication of structures having finer geometries that those on traditional lead frames. For example, MIS can enable spacings between adjacent features as narrow as 25 μm whereas in standard plastic packaging technologies and in traditional lead frames features cannot be spaced closer than approximately 100 μm to 150 μm.

A traditional lead frame (which may be referred to as a regular lead frame herein) is a single layer sheet of metal that is etched or stamped with a pattern, used as a support for a chip and forms metal leads which connect the chip to the outside of the package. The chip is first connected to this traditional lead frame before plastic is molded around the chip and lead frame assembly. In a traditional lead frame process, the metal sheet has to be a contiguous structure capable of holding together an array of ICs before the molding process. After molding, the individual IC's can be cut from the support lead frame.

A traditional lead frame is continuous until after chip mounting and overmolding. After molding and the assembly is cut from the outside frame, after which the metal may be discontinuous, supported by molding. The limitation is that the metal is constrained to be contiguous with the perimeter of the package.

In a typical MIS fabrication process, plastic is molded around a metal pattern before the chip is mounted on the surface of the MIS. The plastic gives structural integrity before adding the chip. Thus, the metal does not have to provide mechanical support and can be made with much finer geometries. This combined metal and plastic structure is known as a Molded Interconnect Substrate (MIS). After the chip is added, another plastic overmold may be added to encapsulate the chip and MIS together to create the final packaged substrate with mounted chip.

In MIS, the vias (pillars) are formed by lithographic patterning (cost-effective to get small geometries and arbitrary shapes) and molding is applied after the metal vias are formed. During MIS molding the metal is held in place by the layer below it. Thus an MIS substrate provides support for creating another MIS substrate layer above it and so on.

To form the inductor structures described herein, multiple MIS layers may be stacked on top of each other prior to adding the chip and before a final plastic overmold layer is applied.

As the MIS comprises plastic, it is non-conductive and additionally can provide mechanical support to multiple components simultaneously without shorting them out.

In MIS, the term "lead frame" may be used to describe the whole MIS or a metal layer within the MIS. To avoid confusion, the term lead frame, with regards to the MIS, used herein will refer to a metal layer.

The fine geometries provided by MIS is beneficial for the production of inductor structures that occupy small areas when compared to inductors formed on regular lead frames. Additionally MIS allows more loops of an inductor structure to be packed into the same area when compared with regular lead frames.

The first and second conductive materials 110, 114 are formed using routing traces and the conductive pillars 118 comprise one or more via. Multiple vias may be used to form each conductive pillar 118 to increase the height of the inductor structure 108, thereby increasing its inductance.

In a further embodiment only one of the first and second conductive materials 110, 114 may be formed using routing traces.

In packaging substrates, vias may be implemented using copper pillars. Copper pillars allow very low cost, low resistance interconnects between the chip 202, lead frames within the packaging substrate 200, and the PCB 212. In the present embodiment the first and second conductive materials 110, 114 are provided by lead frames. Additionally, a copper pillar can be used to implement a thick metal interconnect which can increase the height of the inductor structure 108, which increases the area enclosed by the coil (110+114+118). The MIS and copper pillar combination is extremely durable and highly reliable.

In the present embodiment of the MIS process, the copper interconnect patterns of the first and second conductive layers 110, 114 do not need to provide any structural support, and therefore do not have to be contiguous, which allows patterns not possible in a traditional lead frame to be realised.

The second conductive material 114 may be provided by an MIS lead frame comprising copper and having a height of 150 μm. The conductive pillars 118, implemented using copper pillars may have a height of 65 μm. The first conductive material 110 may be provided by thick copper on silicon and/or 3 μm of copper and 5 μm of aluminium.

Alternatively, both the first conductive material 110 and the second conductive material 114 may be provided by MIS lead frames.

In a flip chip assembly, conductive pillars can be grown on the chip. A solder connection can be provided on the conductive pillars to enable coupling of the chip to the MIS.

The amount of metal in the coil (110+114+118) has an impact on the resistance of the coil (110+114+118), where more metal means a smaller resistance. A small resistance is desirable as it enables a high current to flow through the coil (110+114+118) and also leads to less issues with parasitics. For a practical implementation, the resistance of this inductor structures 108 described herein will be less than 0.5 mohm per loop and therefore should exhibit good current handling capability.

Figure 3B:
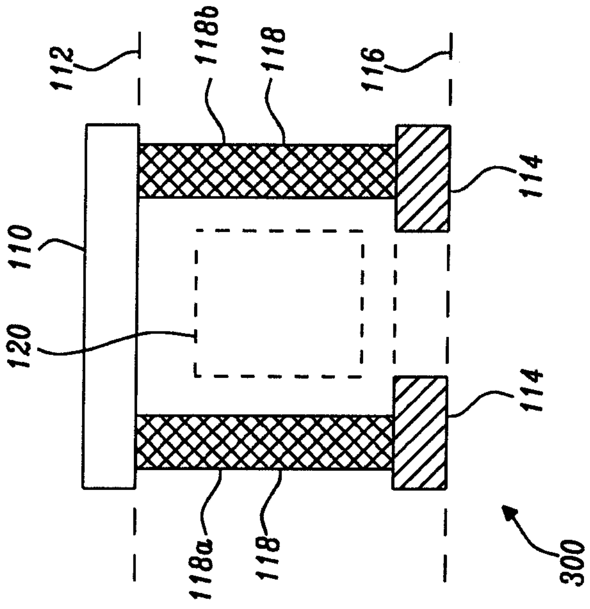
FIG. 3B is a cross section of the inductor structure shown in FIG. 3A.
Figure 3A:
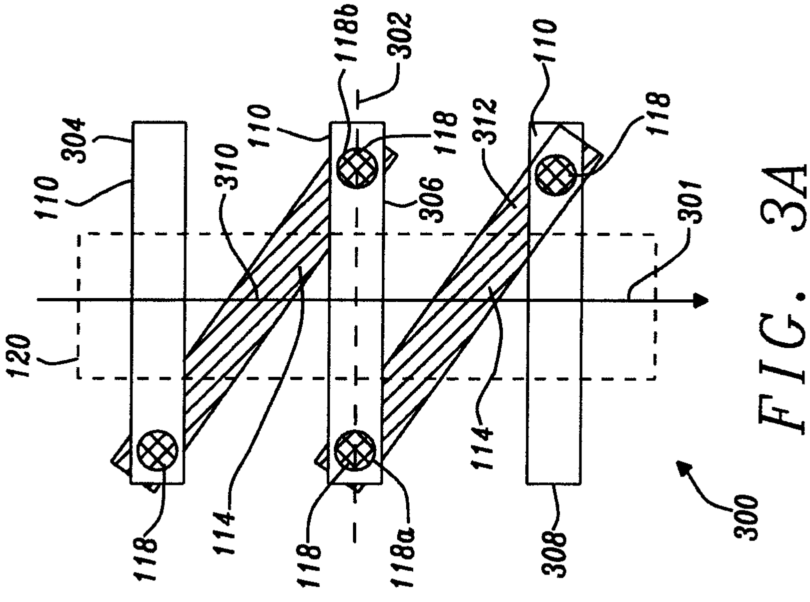
FIG. 3A is a schematic of a top down view of an inductor structure for providing an inductance in accordance with a third embodiment of the present disclosure.

FIG. 3A is a schematic of a top down view of an inductor structure 300 for providing an inductance in accordance with a third embodiment of the present disclosure. The inductor structure 300 is a specific implementation of the inductor structure 108 and as such may be implemented as part of a packaging substrate, such as the packaging substrates 100, 200 as described previously.

The inductor structure 300 shares features with the inductor structure 108 and therefore common features between figures share common reference numerals and variables. It will be appreciated that although the conductive pillars 118 are shown in FIG. 3A, in a physical implementation of the inductor structure 300 it is likely that they would not be visible from this view as they are positioned underneath the first conductive material 110.

In the inductor structure 300 the first conductive material 110, the second conductive material 114 and the conductive pillars 118 are arranged to form the coil (110+114+118) that is arranged as a solenoid. When implemented as part of the packaging substrate 100, 200, the solenoid has an axis 301 that is approximately parallel to the upper surface 102 of the packaging substrate 100, 200.

The coil (110+114+118) may enclose the magnetic material 120. In a further embodiment, the coil may only partially enclose the magnetic material 120.

FIG. 3B is a cross section of the inductor structure 300 through a line 302 as shown in FIG. 3A.

The first conductive material 110 is discontinuous and comprises a plurality of first conductive portions 304, 306, 308 on the first layer 112 and the second conductive material 114 is discontinuous and comprises a plurality of second conductive portions 310, 312 on the second layer 116. Each of the first conductive portions 304, 306, 308 is coupled to at least one of the second conductive portions 310, 312 by at least one of the conductive pillars 118.

In the present embodiment there are three first conductive portions 304, 306, 308 and two second conductive portions 310, 312. It will be appreciated that in further embodiments there may be more or less conductive portions in accordance with the understanding of the skilled person.

Figure 3C:
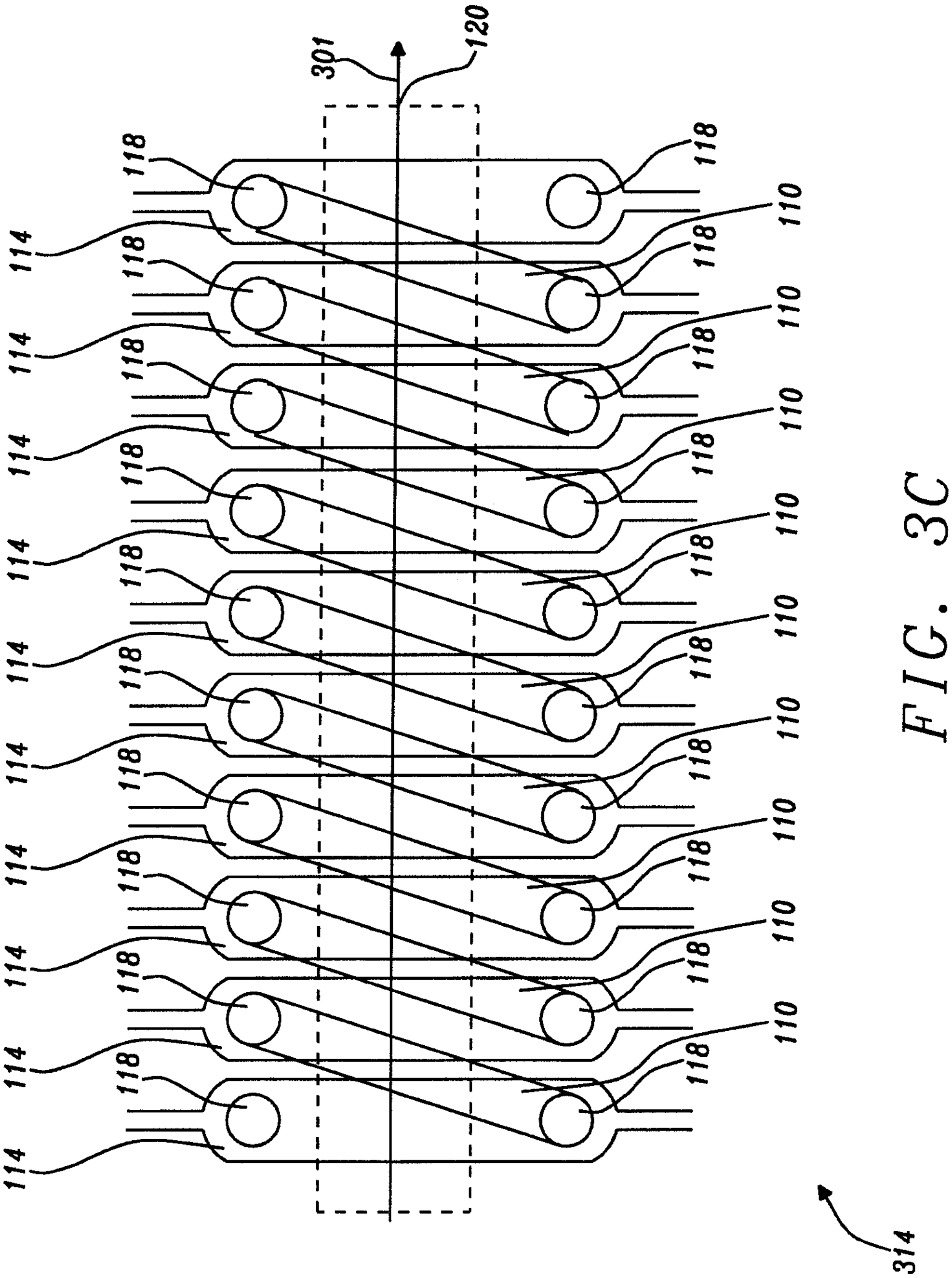
FIG. 3C is a schematic of a top down view of an inductor structure for providing an inductance in accordance with a fourth embodiment of the present disclosure.

FIG. 3C is a schematic of a top down view of an inductor structure 314 for providing an inductance in accordance with a fourth embodiment of the present disclosure. The inductor structure 314 is a specific implementation of the inductor structure 108 and as such may be implemented as part of a packaging substrate, such as the packaging substrates 100, 200 as described previously.

The inductor structure 314 shares features with the inductor structure 108 and the inductor structure 300, and therefore common features between figures share common reference numerals and variables. Compared to the inductor structure 300, the inductor structure 314 comprises the first conductive material 110 comprising nine conductive portions, and the second conductive material 114 comprising ten conductive portions.

In the inductor structure 300 of FIG. 3A, the first conductive portion 306 is coupled to the second conductive portion 312 by the conductive pillar 118*a* and is coupled to the second conductive portion 310 by the conductive pillar 110*b*.

It will be appreciated that more than one of the first conductive portions may be arranged in this manner. For example, as shown by the inductor structure 314 in FIG. 3C. For the inductor structure 314 of FIG. 3C each of the first conductive portions (associated with the first conductive material 110) is coupled to two conductive pillars 118 and for each first conductive portions, the two conductive pillars 118 are coupled to different second conductive portions (associated with the second conductive material 114).

Figure 4A:
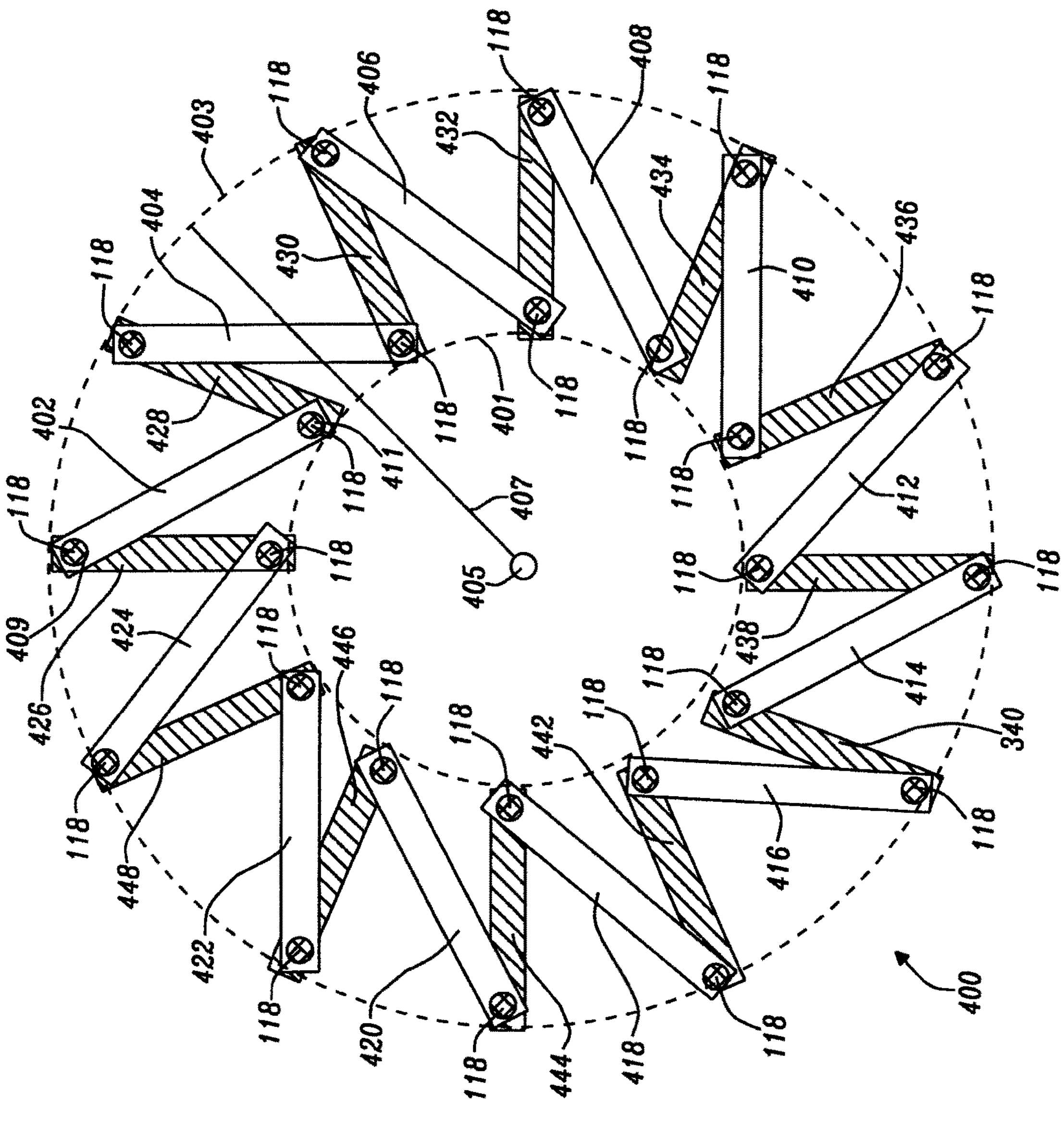
FIG. 4A is a schematic of a top down view of an inductor structure for providing an inductance in accordance with a fifth embodiment of the present disclosure.

FIG. 4A is a schematic of a top down view of an inductor structure 400 for providing an inductance in accordance with a fifth embodiment of the present disclosure. The inductor structure 400 is a specific implementation of the inductor structure 108 and as such may be implemented as part of a packaging substrate, such as the packaging substrates 100, 200 as described previously.

The inductor structure 400 shares features with the inductor structure 108 and therefore common features between figures share common reference numerals and variables. It will be appreciated that although the conductive pillars 110 are shown in FIG. 4A, in a physical implementation of the inductor structure 400 it is likely that they would not be visible from this view as they are positioned underneath the first conductive material 110.

In the inductor structure 400 the first conductive material 110, the second conductive material 114 and the conductive pillars 118 are arranged to form the coil (110+114+118) that is arranged as a toroid.

The toroid formed by the coil (110+114+118) has an inner circumference 401 and an outer circumference 403 around a central axis 405. The inner circumference 401 is closer to the central axis 405 than the outer circumference 403 on a line 407 extending outward from the central axis 405. The conductive pillars 118 at or near the inner circumference 401 are smaller than the conductive pillars 118 at or near the outer circumference 403.

The coil (110+114+118) may enclose a magnetic material 120 (not shown). In a further embodiment, the coil may only partially enclose the magnetic material 120.

The first conductive material 110 is discontinuous and comprises a plurality of first conductive portions 402, 404, 406, 408, 410, 412, 414, 416, 418, 420, 422, 424 on the first layer 112 and the second conductive material 114 is discontinuous and comprises a plurality of second conductive portions 426, 428, 430, 432, 434, 436, 438, 440, 442, 444, 446, 448 on the second layer 116. Each of the first conductive portions 402-24 is coupled to at least one of the second conductive portions 426-448 by at least one of the conductive pillars 118.

Labels denoting the first and second conductive materials 110, 114 have been omitted from FIG. 4A to aid in the clarity of the drawing.

In the present embodiment there are twelve first conductive portions 402-424 and twelve second conductive portions 426-448. It will be appreciated that in further embodiments there may be more or less conductive portions in accordance with the understanding of the skilled person.

Figure 4B:
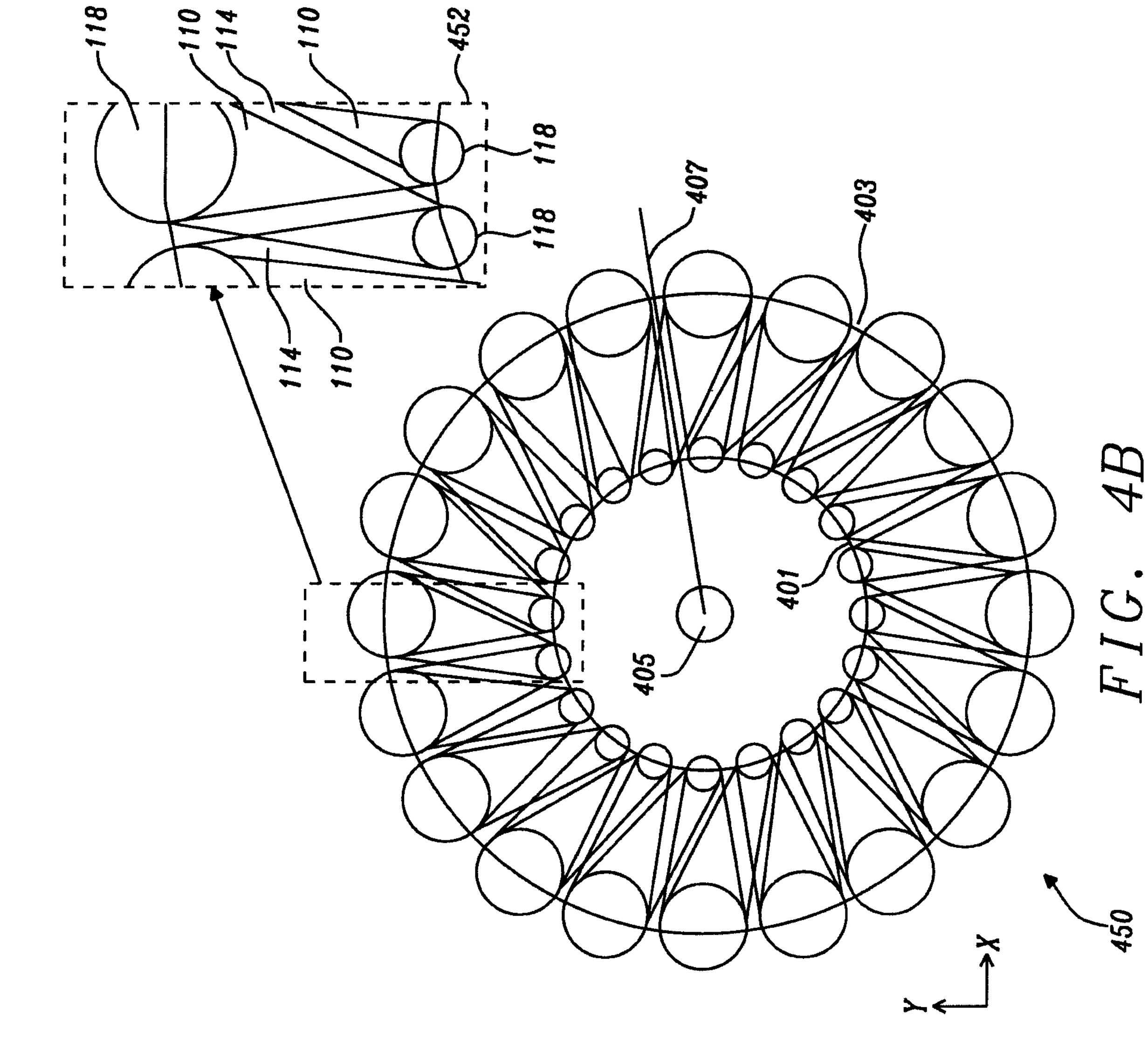
FIG. 4B is a schematic of a top down view of an inductor structure for providing an inductance in accordance with a sixth embodiment of the present disclosure.

FIG. 4B is a schematic of a top down view of an inductor structure 450 for providing an inductance in accordance with a sixth embodiment of the present disclosure. The inductor structure 450 is a specific implementation of the inductor structure 108 and as such may be implemented as part of a packaging substrate, such as the packaging substrate 100, 200 as described previously.

The inductor structure 450 shares features with the inductor structure 108 and the inductor structure 400, and therefore common features between figures share common reference numerals and variables. Compared to the inductor structure 400, the inductor structure 450 comprises more first and second conductive portions and comprises first and second conductive portions of a different shape than those of the inductor structure 400.

Additionally, in the inductor structure 450, the conductive pillars 118 at or near the inner circumference 401 are smaller than the conductive pillars 118 at or near the outer circumference 403.

To ensure clarity of the drawing, an exploded view 452 of a section of the inductor structure 450 is shown and labelled. It will be clear to the skilled person how the labelled features of the exploded view 452 applies to the remainder of the inductor structure 450.

Figure 4D:
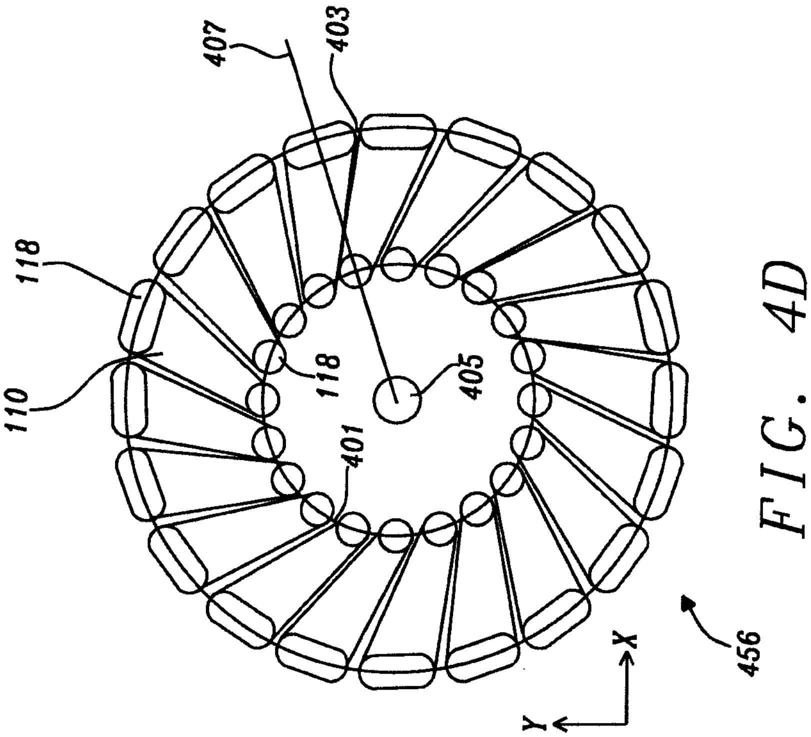
FIG. 4D is a schematic of a top down view of an inductor structure for providing an inductance in accordance with an eighth embodiment of the present disclosure.
Figure 4C:
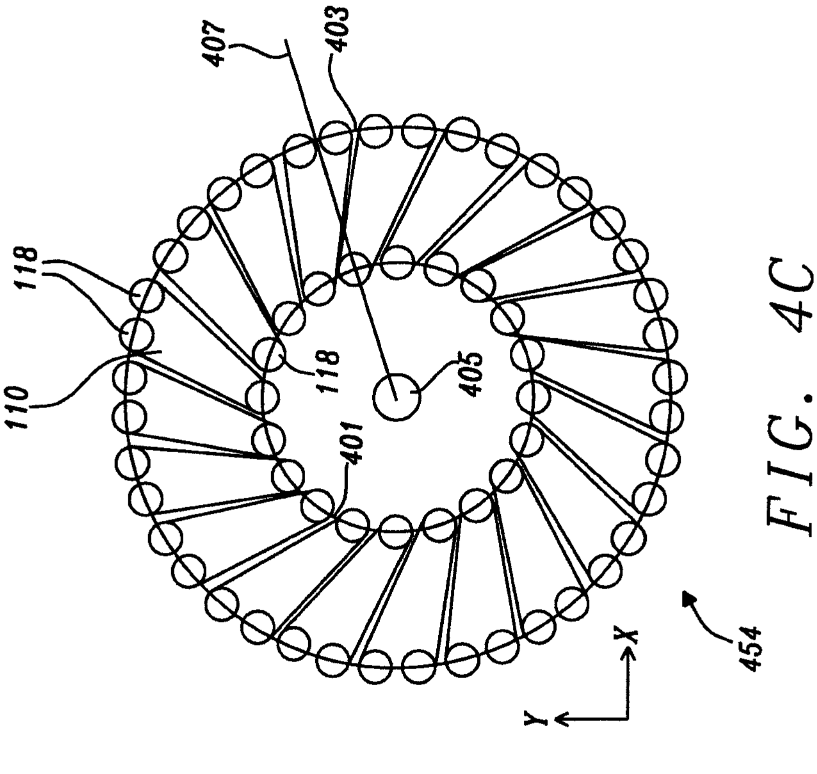
FIG. 4C is a schematic of a top down view of an inductor structure for providing an inductance in accordance with a seventh embodiment of the present disclosure.

FIG. 4C is a schematic of a top down view of an inductor structure 454 for providing an inductance in accordance with a seventh embodiment of the present disclosure. The inductor structure 454 is a specific implementation of the inductor structure 108 and as such may be implemented as part of a packaging substrate, such as the packaging substrates 100, 200 as described previously.

The inductor structure 454 shares features with the inductor structure 108 and the inductor structure 400, and therefore common features between figures share common reference numerals and variables.

In the inductor structure 454 the first conductive material 110, the second conductive material 114 and the conductive pillars 118 are arranged to form the coil (110+114+118) that is arranged as a toroid.

In the inductor structure 454, for each of the first conductive portions (associated with the first conductive material 110), there are less conductive pillars 118 at or near the inner circumference 401 used to couple to one second conductive portion (associated with the second conductive material 114) than at or near the outer circumference 403 used to couple to another second conductive portion 118. Specifically, there is one conductive pillar 118 at the inner circumference 401 and two conductive pillars 118 at the outer circumference 403 for each first conductive portion in the present embodiment. In the present embodiment all conductive pillars 118 are the same size.

To aid in the clarity of the drawing, only a single first conductive portion and its associated conductive pillars have been labelled. The second conductive material 114 is not labelled.

FIG. 4D is a schematic of a top down view of an inductor structure 456 for providing an inductance in accordance with an eighth embodiment of the present disclosure. The inductor structure 456 is a specific implementation of the inductor structure 108 and as such may be implemented as part of a packaging substrate, such as the packaging substrates 100, 200 as described previously.

The inductor structure 456 shares features with the inductor structure 108 and the inductor structure 400, and therefore common features between figures share common reference numerals and variables.

In the inductor structure 456 the first conductive material 110, the second conductive material 114 and the conductive pillars 118 are arranged to form the coil (110+114+118) that is arranged as a toroid.

To aid in the clarity of the drawing, only a single first conductive portion and its associated conductive pillars have been labelled. The second conductive material 114 is not labelled.

Figure 4E:
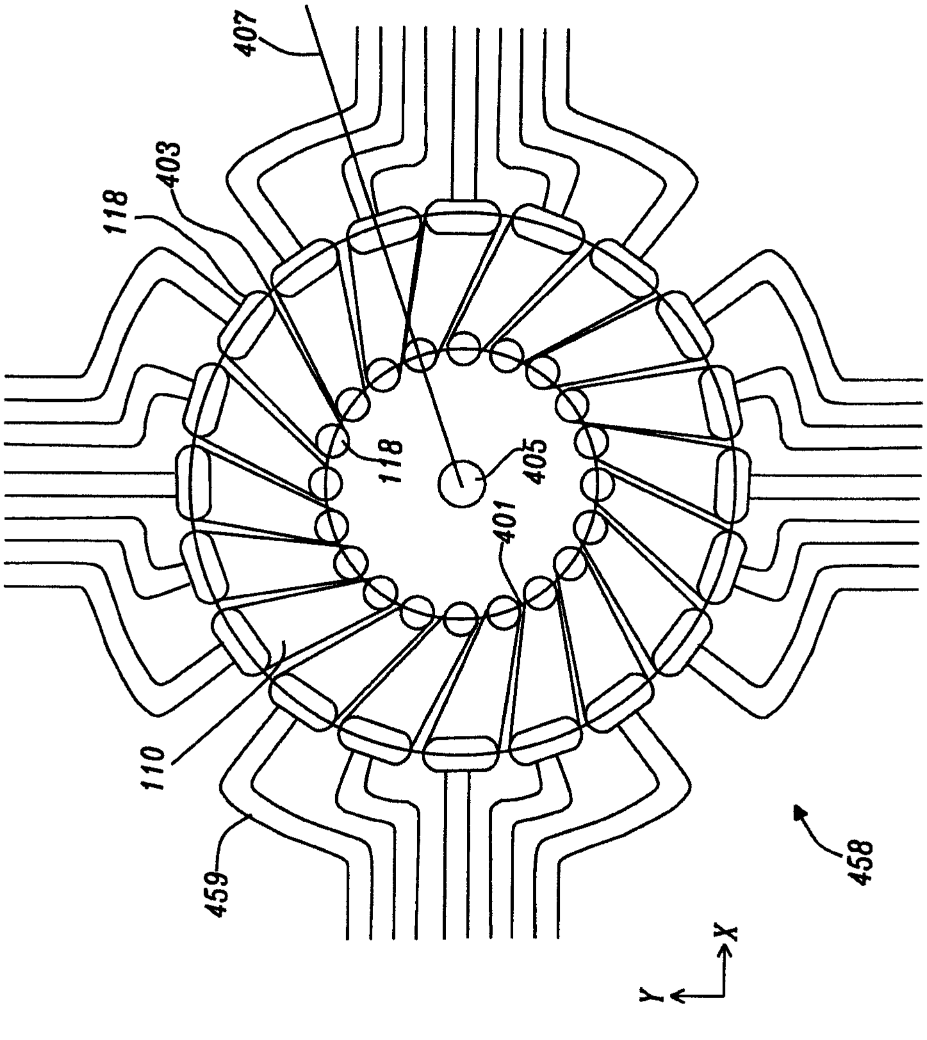
FIG. 4E is a schematic of a top down view of an inductor structure for providing an inductance in accordance with a ninth embodiment of the present disclosure.

FIG. 4E is a schematic of a top down view of an inductor structure 458 for providing an inductance in accordance with a ninth embodiment of the present disclosure. The inductor structure 458 is a specific implementation of the inductor structure 108 and as such may be implemented as part of a packaging substrate, such as the packaging substrates 100, 200 as described previously.

The inductor structure 458 shares features with the inductor structure 108 and the inductor structure 400, and therefore common features between figures share common reference numerals and variables.

In the inductor structure 458 the first conductive material 110, the second conductive material 114 and the conductive pillars 118 are arranged to form the coil (110+114+118) that is arranged as a toroid.

The inductor structure 108 may be coupled to other components by a support structure 459.

To aid in the clarity of the drawing, only a single first conductive portion and its associated conductive pillars have been labelled. Additionally, only one of the support structures 459 has been labelled. The second conductive material 114 is not labelled.

Figure 4F:
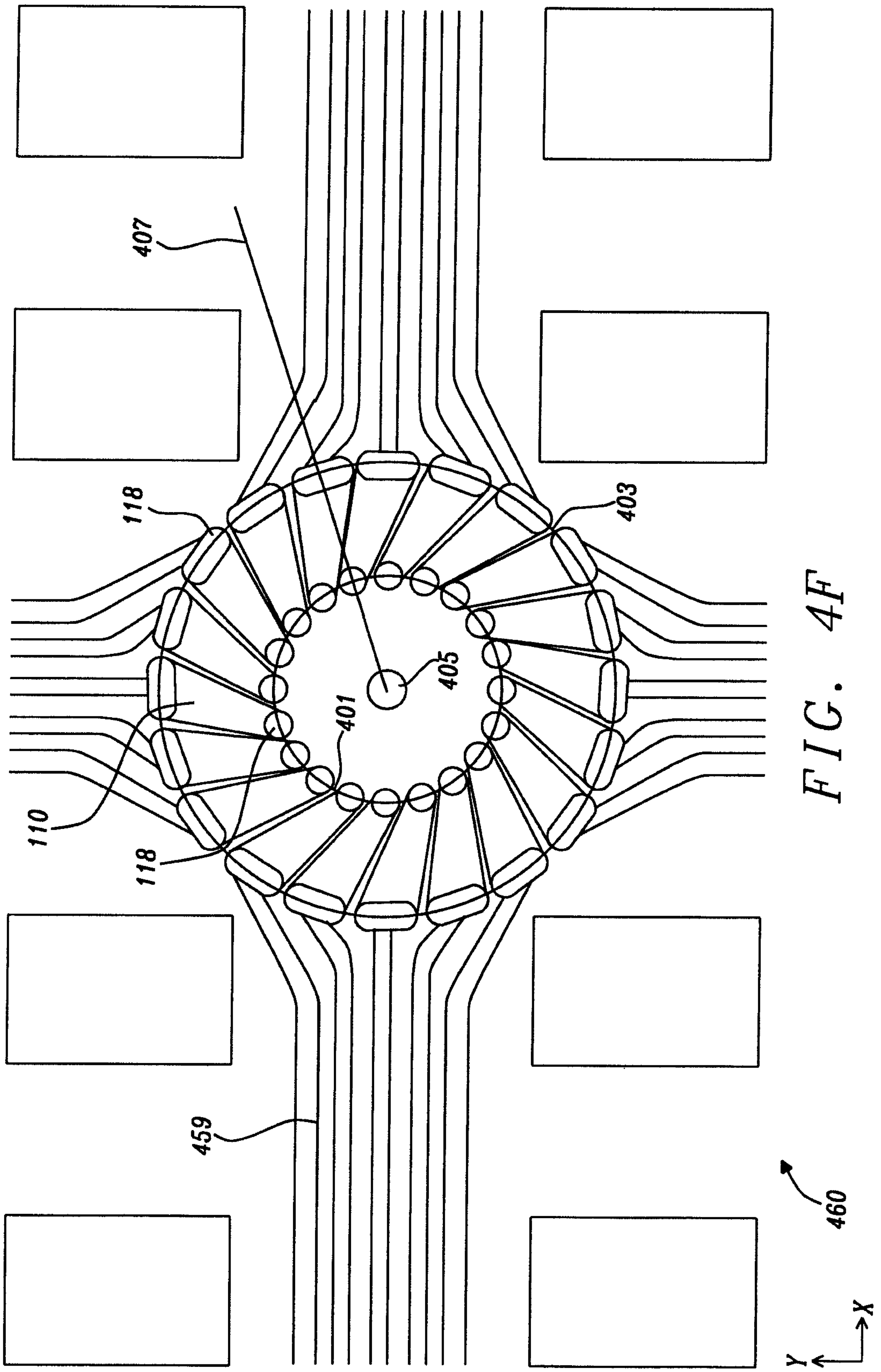
FIG. 4F is a schematic of a top down view of an inductor structure for providing an inductance in accordance with a ninth embodiment of the present disclosure.

FIG. 4F is a schematic of a top down view of an inductor structure 460 for providing an inductance in accordance with a ninth embodiment of the present disclosure. The inductor structure 460 is a specific implementation of the inductor structure 108 and as such may be implemented as part of a packaging substrate, such as the packaging substrates 100, 200 as described previously.

The inductor structure 460 shares features with the inductor structure 108 and the inductor structure 400, and therefore common features between figures share common reference numerals and variables.

In the inductor structure 460 the first conductive material 110, the second conductive material 114 and the conductive pillars 118 are arranged to form the coil (110+114+118) that is arranged as a toroid.

The inductor structure 108 may be coupled to other components by a support structure 459.

To aid in the clarity of the drawing, only a single first conductive portion and its associated conductive pillars have been labelled. Additionally, only one of the support structures 459 has been labelled. The second conductive material 114 is not labelled.

Figure 4G:
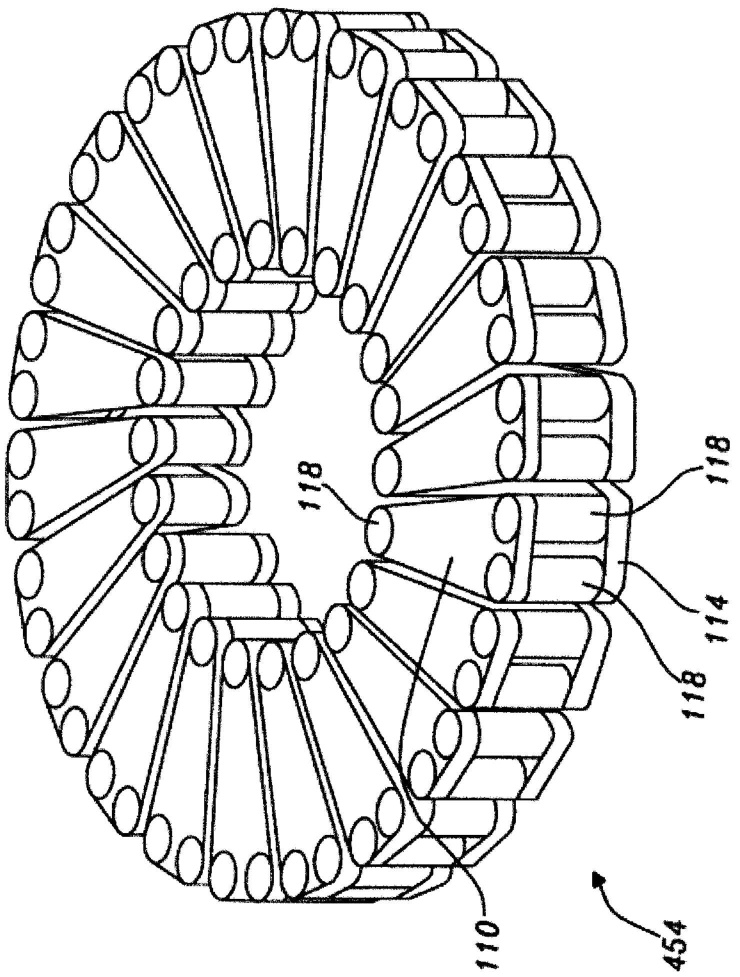
FIG. 4G is a perspective view of the inductor structure of FIG. 4C.

FIG. 4G is a perspective view of the inductor structure 454. To aid in the clarity of the drawing, the first conductive material 110 is only labelled for a single first conductive portion, the second conductive material 114 is only labelled for a single second conductive portion. Additionally, only three conductive pillars are labelled 118.

For each of the inductor structures 400, 450, 454, 456, 458, 460, each of the first conductive portions is coupled to two conductive pillars and for each first conductive portion, the two conductive pillars are coupled to different second conductive portions. For example, for the inductor structure 400, the first conductive portion 402 is coupled to the second conductive portions 426 and 428 by a conductive pillar 409 and a conductive pillar 411, respectively.

The inductor structures 400, 450, 454, 456, 458, 460 are arranged as toroids and therefore provides good containment of a magnetic field, low electromagnetic interference (EMI) due to the B field being approximately equal to zero outside the toroid, and low eddy current losses in surrounding conductors. Additionally, toroids provide a higher inductance per unit area when compared to solenoids, however solenoids may be more desirable for certain packaging substrate sizes. Toroids are particularly useful for power applications.

A practical physical implementation of one of the toroid-type inductor structures 400, 450, 454, 456, 458, 460 within a packaging substrate may be implemented in an area that is less than 1 $mm^2$ and exhibit high current capacity with a good Q factor.

The packaging substrates comprising inductor structures disclosed herein provide a cost effective inductor with high current carrying capability suitable for use in Power and RF applications using high volume semiconductor processes.

Figure 5:
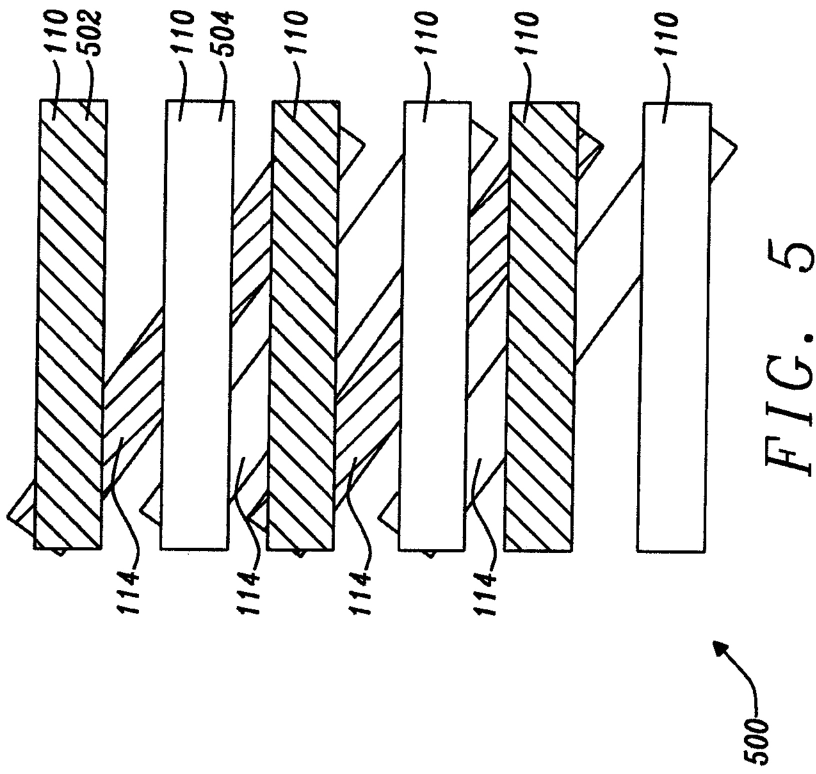
FIG. 5 is a schematic of a top down view of an inductor structure for providing an inductance in accordance with a tenth embodiment of the present disclosure.

FIG. 5 is a schematic of a top down view of an inductor structure 500 for providing an inductance in accordance with a tenth embodiment of the present disclosure. The inductor structure 500 is a specific implementation of the inductor structure 108 and as such may be implemented as part of a packaging substrate, such as the packaging substrates 100, 200 as described previously. The inductor structure 500 may comprise two or more coils 502, 504, each having an inductance and arranged to form a transformer or a coupled inductor. In consideration of a packaging substrate comprising two coils 502, 504, at least one of the two coils is formed by one of the inductor structures as described previously. Both coils 502, 504 may comprise the first conductive material 110, the second conductive material 114, and may both each comprise a plurality of conductive pillars (not shown). The two coils 502, 504 may be arranged as a toroid transformer, which may be in a double helix configuration. FIG. 5 show a portion of a toroid transformer wound in a double helix configuration with the curvature omitted to aid in the clarity of the drawing. Implementation of a toroid transformer within a packaging substrate yields all the normal benefits of toroid transformers including signal integrity, efficiency, etc.

Various improvements and modifications may be made to the above without departing from the scope of the disclosure.

What is claimed is:

1. A packaging substrate for mounting an integrated circuit and/or a circuit component comprising:

an upper surface for mounting the integrated circuit and/or circuit component;

a lower surface opposite to the upper surface, wherein the lower surface is for mounting to a printed circuit board (PCB);

a non-conductive material; wherein the non-conductive material is a plastic:

an inductor structure at least partially embedded in the non-conductive material and comprising:

i) a first conductive material at least partially on a first layer;

ii) a second conductive material at least partially on a second layer; and iii) a plurality of conductive pillars; wherein:

the first conductive material, the second conductive material and the conductive pillars are arranged to form a first coil and a second coil having an inductance the first coil and second coil are arranged as a toroid transformer wound in a double helix configuration; and at least one first via is arranged to enable electrical coupling of the inductor structure to the integrated circuit and/or circuit component; and at least one second via is arranged to enable electrical coupling of the inductor structure to the PCB; and the packaging substrate is a molded interconnect substrate.

2. The packaging substrate of claim 1, wherein:

the first conductive material is discontinuous, such that the first conductive material comprises a plurality of first conductive portions on the first layer; and the second conductive material is discontinuous, such that the second conductive material comprises a plurality of second conductive portions on the second layer; wherein:

each of the first conductive portions is coupled to at least one of the second conductive portions by at least one conductive pillar.

3. The packaging substrate of claim 2, wherein at least one of the first conductive portions is coupled to one of the second conductive portions by a first conductive pillar and is coupled to another of the second conductive portions by a second conductive pillar.

4. The packaging substrate of claim 3, wherein:

each of the first conductive portions is coupled to two conductive pillars; and for each first conductive portion, the two conductive pillars are coupled to different second conductive portions.

5. The packaging substrate of claim 3, wherein:

the first coil is arranged as a toroid having an inner circumference and an outer circumference around a central axis; and the inner circumference is closer to the central axis than the outer circumference on a line extending outward from the central axis.

6. The packaging substrate of claim 5, wherein the conductive pillars at or near the inner circumference are smaller than the conductive pillars at or near the outer circumference.

7. The packaging substrate of claim 5, wherein:

for each of the first conductive portions, there are less conductive pillars at or near the inner circumference used to couple to one second conductive portion than at or near the outer circumference used to couple to another second conductive portion.

8. The packaging substrate of claim 1, wherein the non-conductive material is a plastic.

9. The packaging substrate of claim 1, wherein at least one of the first conductive material, the second conductive material and the conductive pillars comprises at least one of copper and aluminium.

10. The packaging substrate of claim 1, wherein the first coil at least partially encloses a magnetic material.

11. The packaging substrate of claim 1, wherein at least one of the first and second conductive materials are formed using routing traces.

12. A method of providing a packaging substrate for mounting an integrated circuit and/or a circuit component comprising:

providing an upper surface for mounting the integrated circuit and/or circuit component;

providing a lower surface opposite to the upper surface, wherein the lower surface is for mounting to a printed circuit board (PCB);

providing a non-conductive material, wherein the non-conductive material is a plastic;

providing an inductor structure at least partially embedded in the non-conductive material and comprising:

i) a first conductive material at least partially on a first layer;

ii) a second conductive material at least partially on a second layer; and iii) a plurality of conductive pillars; wherein:

the first conductive material, the second conductive material and the conductive pillars are arranged to form a first coil and a second coil having an inductance; and the first coil and second coil is arranged as a toroid transformer wound in a double helix configuration; and providing at least one first via is arranged to enable electrical coupling of the inductor structure to the integrated circuit and/or circuit component; and providing at least one second via is arranged to enable electrical coupling of the inductor structure to the PCB; and the packaging substrate is a molded interconnect substrate.

* * * * *